(12) United States Patent
Panaoussis

(10) Patent No.: US 6,404,356 B1
(45) Date of Patent: Jun. 11, 2002

(54) WAVE DEMODULATION PROCESSOR

(75) Inventor: Spyros Panaoussis, Austin, TX (US)

(73) Assignee: Cennoid Technologies, Inc., Austin, TX (US)

( * ) Notice: Subject to any disclaimer, the term of this patent is extended or adjusted under 35 U.S.C. 154(b) by 0 days.

(21) Appl. No.: 09/576,588

(22) Filed: May 22, 2000

(51) Int. Cl.$^7$ ................................. H03M 7/00

(52) U.S. Cl. ........................... 341/60; 341/143

(58) Field of Search ................ 341/60, 67, 76, 341/77, 143; 395/601; 235/154, 449; 711/170, 103, 68

(56) References Cited

U.S. PATENT DOCUMENTS

| | | | | | |
|---|---|---|---|---|---|
| 3,562,504 | A | * | 2/1971 | Harris | 235/154 |
| 5,652,878 | A | * | 7/1997 | Craft | 395/601 |
| 5,780,828 | A | * | 7/1998 | Mos et al. | 235/449 |
| 6,145,069 | A | * | 11/2000 | Dye | 711/170 |

* cited by examiner

Primary Examiner—Peguy JeanPierre
Assistant Examiner—Joseph J Lauture
(74) Attorney, Agent, or Firm—Welsh & Katz, Ltd.

(57) ABSTRACT

A method and apparatus are provided for compressing data. The method includes the steps of determining a flux, scaling factor and sign of a difference between a new sample and a previous sample and encoding the difference of the new sample over the previous sample based upon the determined flux, scaling factor and sign of the new sample.

31 Claims, 12 Drawing Sheets

FIG. 3

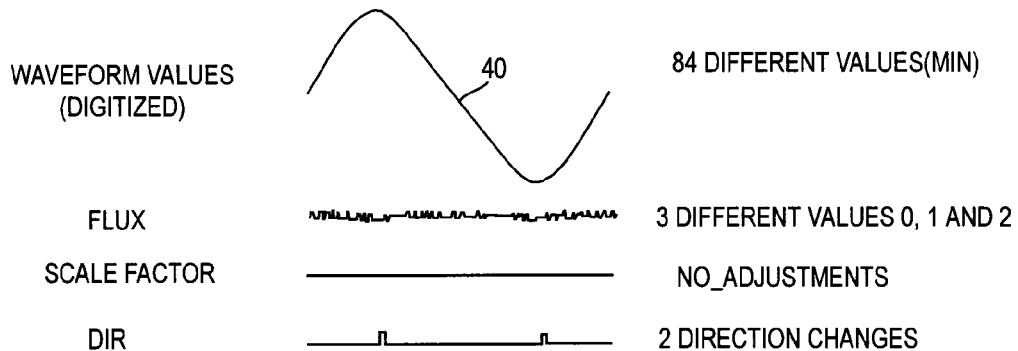

WAVEFORM VALUES (DIGITIZED) — 84 DIFFERENT VALUES(MIN)

FLUX — 3 DIFFERENT VALUES 0, 1 AND 2

SCALE FACTOR — NO_ADJUSTMENTS

DIR — 2 DIRECTION CHANGES

FIG. 4

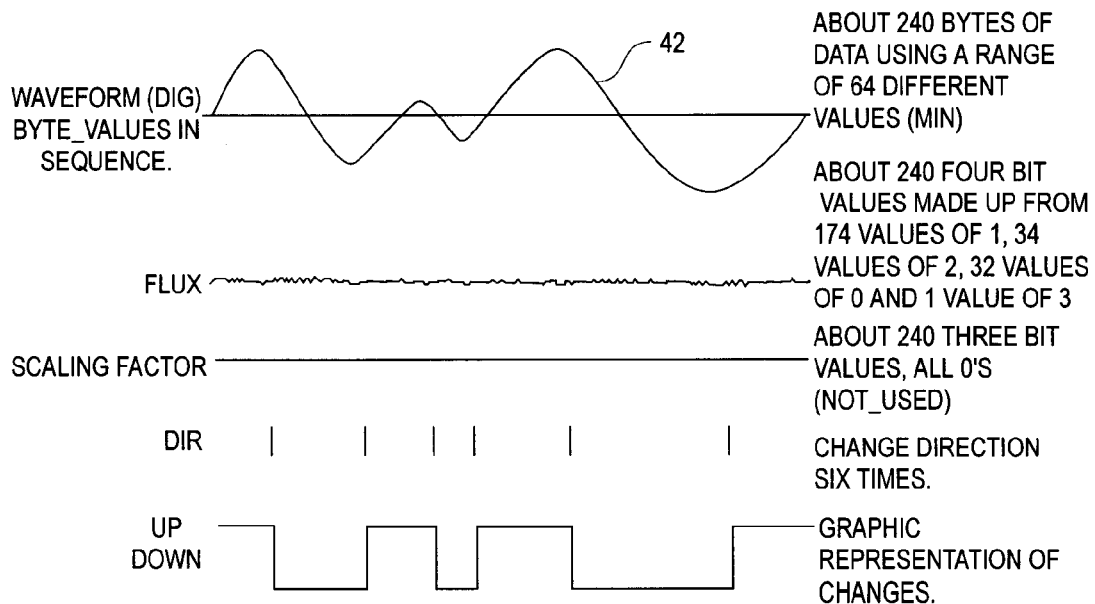

WAVEFORM (DIG) BYTE_VALUES IN SEQUENCE. — ABOUT 240 BYTES OF DATA USING A RANGE OF 64 DIFFERENT VALUES (MIN)

FLUX — ABOUT 240 FOUR BIT VALUES MADE UP FROM 174 VALUES OF 1, 34 VALUES OF 2, 32 VALUES OF 0 AND 1 VALUE OF 3

SCALING FACTOR — ABOUT 240 THREE BIT VALUES, ALL 0'S (NOT_USED)

DIR — CHANGE DIRECTION SIX TIMES.

UP DOWN — GRAPHIC REPRESENTATION OF CHANGES.

WAVE DEMODULATION PROCESSOR

FIELD OF THE INVENTION

The field of the invention relates to information signals and more particularly to the compression of information signals.

BACKGROUND OF THE INVENTION

Methods of compressing data are known. While methods vary widely, the objective of each method is to reduce a volume of a file by reducing the number of information bits necessary to accurately represent the file. In the past, a number of methods have been developed to achieve this objective. One method reduces a file's volume by counting repeating bytes where ever they occur in a continuous sequence and representing the repeated bytes as simply the repeated byte followed by a number of instances of the repeated byte.

Other methods rely upon tables to re-arrange the meaning of bit sequences. Such tables are useful in the case where bit sequences frequently repeat, such as in text files.

Under these methods, a table is created and a table location (i.e., defined by the Cartesian coordinates) may be used to represent the contents of the location of the table. Further, the locations of the table may be ordered. The table locations may be identified by the smallest bit sequence necessary to precisely identify the location. Lower order locations require a lesser number of bits to precisely identify the location. Higher order locations require more bits to identify the location. For example, the first location may be given the identifier "0". The second location may be given the identifier "1", and the third "10", and so on.

Under this method, the frequency of occurrence of the characters are measured. The character which is found to repeat the most frequently is placed in the lowest ordered location of the table. The next most frequently occurring character is placed next. Since the more frequently occurring characters require less bits to precisely identify the character, compression occurs by representing the character by a table location.

While table-based compression is effective in some cases, it is less effective in other cases where the data is random. Accordingly, a need exists for a compression method that can be used with or instead of table-based compression.

SUMMARY

A method and apparatus are provided for compressing data. The method includes the steps of determining a flux, scaling factor and sign of a difference between a new sample and a previous sample and encoding the difference of the new sample over the previous sample based upon the determined flux, scaling factor and sign of the new sample.

BRIEF DESCRIPTION OF THE DRAWINGS

FIG. 3 depicts alternate waveforms processed and interim signal values provided by the system of FIG. 1;

FIG. 4 depicts alternate waveforms processed and interim signal values provided by the system of FIG. 1;

DETAILED DESCRIPTION OF A PREFERRED EMBODIMENT

Figure 1:
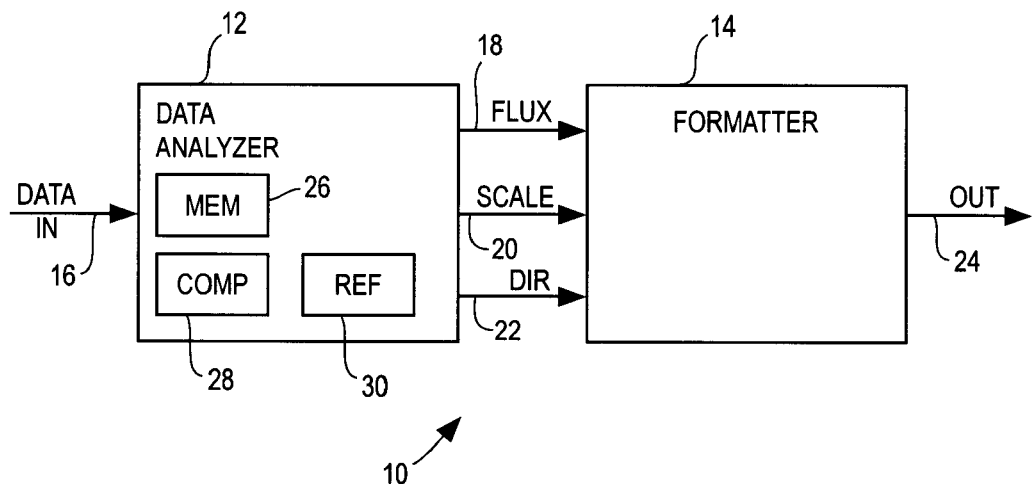
FIG. 1 is a block diagram of apparatus for compressing data in accordance with an illustrated embodiment of the invention.

FIG. 1 is a block diagram of a data compression/decompression system (i.e., a waveform demodulation processor (WDP)) 10, generally, in accordance with an illustrated embodiment of the invention. The compression process and decompression processes are substantially identical (albeit with a reversal of process steps).

During compression, a data analyzer 12 receives data 16 from an external source (either analog or digital), analyzes the data to determine a set of descriptive values including a flux value 18, a scaling factor 20 and a direction 22 and provides these values to a formatter 14. The formatter 14 receives the flux value, scaling factor and direction and formats the descriptive values into a compressed serial bit stream 24. Within a decoder 10 (i.e., operating as a decompressor), the process may be reversed to recover the data 16.

Under the illustrated embodiment, a data sample received on input 16 ($S_1$) is compared with a previous sample ($S_O$) to determine a difference value ($S_1-S_o$=DIFF). The difference value is then compared with number of other values. First, the absolute value of the difference is compared with a reference value (Vrf) provided by a reference source 30 to determine a scaling factor (D). If the magnitude of the difference is greater than the value provided by the reference source 30, the scaling factor is given a value equal to an integer multiple of the reference value (D=DIFF/Vrf). If the difference value is less than the reference value, the scaling factor is given a value of zero.

Next, where the difference value is smaller than the reference value (or to the extent the difference value is greater than an integer multiple of the reference value), the difference value is compared with the reference value and assigned a proportionality value (herein referred to as a flux value "d"). Finally, the sign of the difference signal is examined to determine a sign (SGN) of the new sample. The sign may have values of +1 or −1 (i.e., SGN=+1 or −1). The relationship of the samples may be as follows: $S_1=(S_o)+(d+(D*Vrf))*SGN$.

To demonstrate the advantages of compression using the three descriptor values of scaling factor, flux and direction, a number of examples will be discussed in general. Following the general discussion, the format of the compressed samples will be considered.

As a first example, consider an 8-bit binary counter progressing from "00000000", ("00" hex) to "11111111 ("ff" hex), with the counter incrementing by a value of "1" during each sample period. The output of this 8-bit counter may be considered as an example of a particular waveform designated to be compressed and stored. Over the sampling period considered, 256 sample values are created. For a frequency-based compression method (e.g., using Hoffman compression), every byte has a different value (i.e., no value is repeated), therefore the frequency-based compression methods of Hoffman would be ineffective for this example.

When the data of this example is processed by the data analyzer 12, a difference between a current byte value and a previous byte value is determined. The data analyzer 12 then breaks down this relationship into the 3 elements of: 1) minor changes (flux) of from 0 to n−1; 2) major changes (scaling factor); and 3) direction.

To more precisely understand this example, consider the first 32 samples (i.e., from 00 hex to 1f hex). Table I (shown below) summarizes the relationship of the sample values (top 2 rows) to the three values of flux, scaling factor and direction.

TABLE I

| | |
|---|---|
| Sample Values | 00000000000000001111111111111111 |
| | 0123456789abcdef0123456789abcdef |
| Flux | 01111111111111111111111111111111 |
| Scale Factor | 00000000000000000000000000000000 |
| Dir | 00000000000000000000000000000000 |

It should be noted that in Table I, the sample values are read vertically; that is, the upper row is the most significant hex bit (nibble) of a sample and the second row is the least significant nibble of that same sample. Further, with regard to direction (DIR), a "0" means the same direction and a "1" means a change in direction.

Under the illustrated embodiment, the flux value may be expressed as a set of four-bit values. The scale factor may be expressed as a set of three-bit values and the direction as a set of one-bit values.

From an examination of Table I, it can be seen that the original sample values and output of the system 10 undergo a transformation. Where the flux, scale factor and direction are concatenated into a pair of hex words (i.e., the direction bit is appended to the beginning of the scale factor and the direction and scale factor appears in the second position of the pair of hex words), the first sample value "00" may have the compressed representation of "01". The second sample value "01" may be transformed to "011", the third "10" to "01", etc. The compressed representations may be further collected into a string of compressed words.

Clearly the WDP 10 does not use a one-for-one transformation process when it converts sample data to compressed words. However, from the viewpoint of the WDP 10, the strings (i.e., the string of sample values and corresponding string of compressed words.) are equivalent based upon the explicitly described value relationship in time.

With regard to the values of Table I, it can be seen that the values can be plotted within an x-y coordinate system. The ordinate "y" may be regarded as amplitude and the abscissa "x" may be regarded as time. As such, the locus of sampled values of Table I would appear as a ramp function.

Since the ramp function has a constant rate of rise, the value of the x position may be regarded as a measure of a position within the string of sample values. The x position may also be also be regarded as a measure of time.

Similarly, knowledge of a "y" value may provide a measure of time due to the constant rise in amplitude. Further, if the constant rise in amplitude can be related to a zero level, then the amplitude can be related to any x value.

The sample values of Table I would require 32 times 8 or 256 bits of memory space to store the sample values, if stored as an uncompressed 8-bit wide sample file. If the samples values of Table I were compressed using a Hoffman-based frequency-relative code size allocation technique (hereinafter "frequency based encoding"), then the size requirement would be as follows. The 32 five-bit codes of Table I would require 32 times 5 bits, plus a code allocation descriptor table of 32 bits. In total, the Hoffman technique would require 192 bits to encode the first 32 bytes of data in Table I.

In contrast, the system 10 would require a maximum of 52 bits to encode the information of Table I. Of the 52 bits, the row of flux values of Table I may be encoded using a 16 bit descriptor table, plus 32 one-bit codes for the actual row of flux values, resulting in a total of 48 bits for the flux information.

The scale factor may be encoded using an 8-bit descriptor table plus 32 one-bit codes for a total of 40 bits for the scale factor information. The row of direction values takes a maximum of 32 bits, so that (flux)+(scale factor)+ (direction)=120 bits. However, since the only value in the direction bit subfile is "0" or "not used" and the only value in the scale factor is "0" or "not used", we can save an extra 38+30 bits for a total required code size of 120–68, or 52 bits. The data analyzer 12, in fact, could compress the data of Table I into a file as short as 32 bits.

In another example, the sample file may include 64 samples where the sample value increases by an incremental value of one for each of the first 32 samples and then decreases by a value of one for the next 32 sample. Table II shows the samples values, the flux, the scale factor and direction for this example.

TABLE II

Sample Values 0000000000000000111111111111111111111111111111111000000000000000
0123456789abcdef0123456789abcdeffedcba9876543210fedcba987654321

Flux

0111111111111111111111111111111101111111111111111111111111111111

Scale Factor

0000000000000000000000000000000000000000000000000000000000000000

TABLE II-continued

Direction

00000000000000000000000000000000100000000000000000000000000000000
Concatenated Compressed Values (read vertically)

00000000000000000000000000000000000000000000000000000000000000000
11111111111111111111111111111111111111111111111111111111111111111

As shown, the flux has a value of one for each sample value except; the first and thirty-third. The direction has a positive value "0" for each sample value except for the thirty-fourth sample, which has a negative value "1", indicating a direction change.

As above, the flux value may be expressed as a set of four-bit values. The scale factor may be expressed as a set of three-bit values and the direction by a set of one-bit values. The flux, scale factor and direction may be compressed independently or combined (e.g., as 8-bit values). Where combined, the compressed values may by concatenated into a set of 2 4-bit values (2 hex values are shown in column form at the bottom of Table II).

The 64 8-bit samples of Table II would require 512 bits of memory, if stored as an uncompressed file. Frequency based encoding would require 352 bits. Frequency based encoding benefits from the fact that the 64 samples of the Table II are basically two back-to-back replicas of the previous example. More specifically, using frequency based encoding, two back-to-back replicas may be encoded by changes within the code allocation descriptor table. Thus, it would require (192 bits+(5*32)) or 352 bits to encode the 512 bits of the original 64 8-bit samples.

The system 10 would require 136 bits to encode the sample values of Table II. The 4-bit string of flux values contains two values (i.e., 0 and 1). The second half of the string is a repetition of the first. A string repetition description of the flux values would not require more than 24 bits. The flux row of Table II may be encoded using a 16 bit table, plus 32 one-bit codes for the row of flux values, resulting in a total of 48 bits for the flux information. The total bit requirement for the compressed string of flux values is 48 plus 24 or 72 bits.

The scaling factor has a value of "0" for each entry of Table II. A string repetition description for the scaling factor would not require more than 24 bits.

The direction may be compressed by means of a change-and-duration descriptor indicating a change in direction at offset +32, with a duration of 31. This would require 32 bits. The direction can be compressed using an 8-bit table plus the 32 bits. The total for compressing the direction is 8+32 or 40 bits.

Thus, the sum total of the three strings of; flux, scaling factor and direction would take 72+24+40, or 136 bits to represent the 512 bits of the 64 samples of Table II. The three strings may be viewed as waveform amplitude change absorbers.

In fact, if the incremental value of the sample values of Table II were 7 instead of 1, the frequency encoding method would require a longer code allocation descriptor table. In contrast, the system 10 produces a flux string which still contains just two values of "0" and "7", instead of "0" and "1". In general, changes in any direction are absorbed by the flux and direction strings, independent of the original byte values.

FIGS. 2–5 provide graphical representations of waveforms and the three values of flux, scaling factor and direction. FIG. 2a provides the data of Table I under a graphical format. FIG. 2b shows the data of Table II under a graphical format.

Figure 2A:
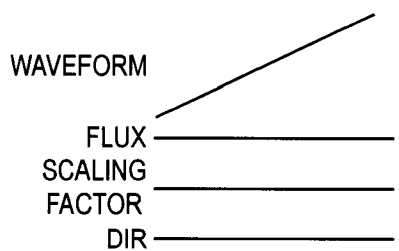
FIG. 2 depicts waveforms processed and interim signal values provided by the system of FIG. 1.
Figure 2B:
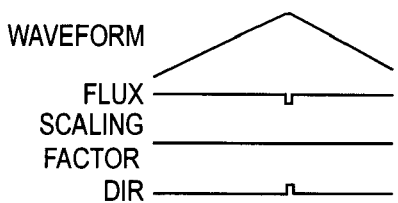
Figure 2C:
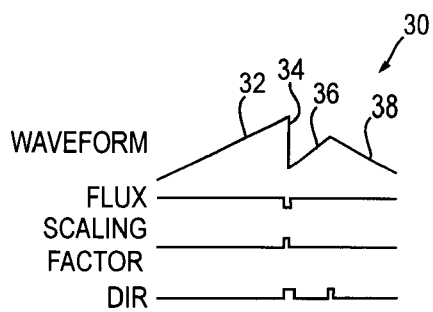

FIG. 2c provides a further example of a more complex waveform 30. As shown, a first portion 32 may increase at a constant incremental rate followed by a discontinuity 34 wherein the wave value decreases to a relatively low value. A third 36 and fourth 38 portion show another relatively constant incremental and decremental rate.

As shown in FIG. 2c, a more complicated waveform 30 results in only small changes in the three values of flux, scaling factor and direction. As should be clear, the waveform 30 may be compressed with only a small increase in the required bits over the examples of FIGS. 2a and 2b.

FIG. 3 shows a constantly varying waveform 40 (e.g., a sine wave). To compress the waveform 40, the formatter 12 processes the sample values of the waveform 40 into values of flux, scaling factor and direction. As shown, the flux values only need to take on three different values. The scaling factor remains at zero. The direction shows only 2 directional changes. As should be clear, the waveform 40 may be compressed at a significant bit savings over prior methods.

FIG. 4 is an example of a waveform 42 that may be a combination of two superimposed waveforms of a relatively similar frequency. Where the waveform is sampled, the waveform 42 may produce 240 bytes of data with a range of 64 different values.

To compress the waveform 42, the analyzer 12 calculates values of flux, scaling factor and direction. The calculated flux may include considerable redundancy which provides a basis for significant compression. As shown, the 240 sample values produce 174 flux values of one, 34 values of two, 32 values of zero and 1 value of three.

The scaling factor of the waveform 42 is zero. The direction changes six times. Based upon the redundancy in the flux values, the constant scaling factor and low number of direction changes, even the complex waveform 42 can be compressed with a considerable reduction in file size.

As FIGS. 2–5 demonstrate, it is clear that a variety of waveforms can be quickly and easily demodulated into the three values of flux, scaling factor and direction. These three values, while independent of the original sample values, contain substantially all of the information of the original waveform. A relative simple combination of the three descriptor values can reproduce the original waveform with no errors.

A compressed record can be expanded quickly, with a minimum of overhead. Where the direction is positive and the scaling factor is zero, the 4-bit flux value "dddd" may simply be added to a prior sample value $S_o$ to obtain a new expanded sample value $S_1$. Where the direction is negative and the scaling factor is zero, the flux value "dddd" is subtracted from the prior value.

Where the scaling factor "D" is non-zero, then the scaling factor may be multiplied by the reference value "Vrf" to recover the expanded scaling factor "D*Vrf". The expanded scaling factor may then be added to the flux value "dddd" as follows, DIFF=(D*Vrf)+dddd. As above, when the direction is positive then the new value is derived as follows: $S_1=S_o+$DIFF. If the direction is negative, then the new value is derived as follows: $S_1=S_o-$DIFF.

We may now turn to a hardware implementation (FIG. 5) of the data analyzer 12. While the data analyzer 12 and formatter 14 are shown as separate elements in FIG. 1, for ease of understanding, the analyzer 12 and formatter 14 will be discussed together in the general example of FIG. 5, which follows.

Figure 5:
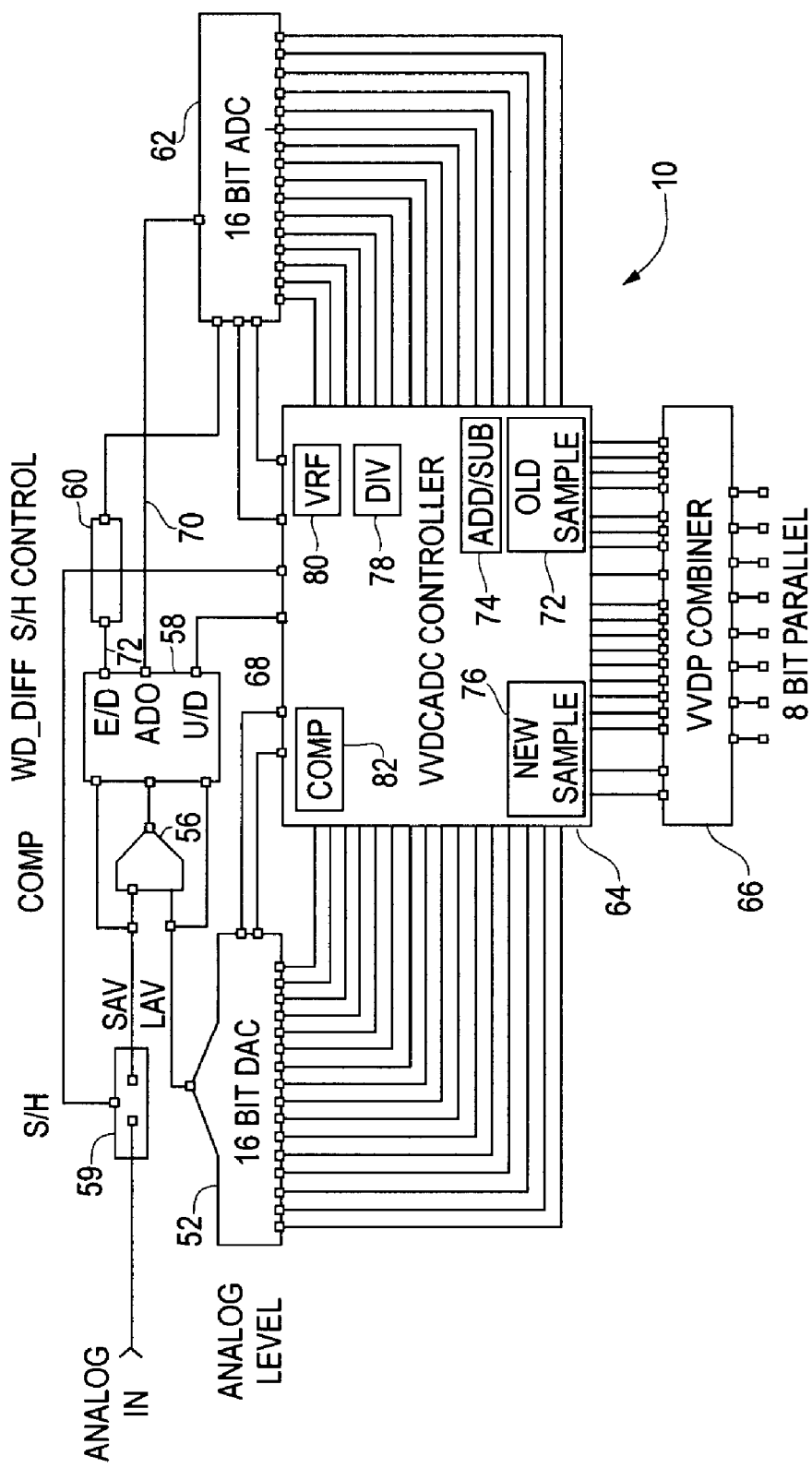
FIG. 5 depicts circuitry the functionality of the system of FIG. 1.

Under the illustrated embodiment of FIG. 5, an analog input signal "$S_i$" may be provided as an input to the compression circuit 10 and an 8-bit sample may be received on a set of output terminals "$S_x$". Within the circuit 10 the input signal $S_i$ may be received, sampled and converted into a variable length compressed representation of that sample.

Table III may be used to illustrate the variable length nature of the output of the compression system 10. While the output $S_x$ of the system 10 may be provided under any of a number of different formats, the first three columns (i.e., the Prefix, Flag bit and Bit Codes) of Table III may be combined under one possible format to form a compressed representation of a sample transferred from the output $S_x$.

TABLE III

| Prefix | Flg | Bit Codes | Width | Dir | Diff |
|--------|-----|-----------|-------|-----|------|
| 0 | x | dddddd | 8 | P | dddddd |
| 10 | x | dddddd | 9 | N | dddddd |
| 110 | 0 | Ddddddd | 12 | P | (0*Vrf)+ddddddd |
| 110 | 1 | Ddddddd | 12 | N | (0*Vrf)+ddddddd |
| 1110 | 0 | DDDDddddddd | 16 | P | (0000*Vrf)+ddddddd |
| 1110 | 1 | DDDDddddddd | 16 | N | (0000*Vrf)+ddddddd |
| 11110 | 0 | DDDDDDDddddddd | 20 | P | Vrf + (0000000*Vrf)+ddddddd |
| 11110 | 1 | DDDDDDDddddddd | 20 | N | Vrf + (0000000*Vrf)+ddddddd |
| 11111 | x | Reserved | Variable | | Used for special commands |

As shown in Table III, in some cases, the Prefix and Bit Codes alone may be concatenated into a compressed sample. The flag bit may also be included within the compressed sample in cases where the scaling factor has a non-zero value.

Where the difference value has a positive sign (i.e., "P" in Table III) and the scaling factor is zero, (as shown in the first row of Table III) the bit width of the new sample is 8 bits. The 8 bits include 7 bits for the flux value and 1 bit for the prefix.

It should be noted in passing that the compressed samples (i.e., as represented by the expression in the last column in Table I) are actually difference values. To recover the new sample at the receiver, the difference value may be added to the previous sample value. If there is no previous sample value, then a previous sample value of zero may be assumed.

Where the difference value has a negative sign (i.e., "N" in Table III) and the scaling factor is zero, (as shown in the second row of Table III) the bit width of the new sample is 9 bits. The 9 bits include 7 bits for the flux value and 2 bits for the prefix.

Where the difference value has a positive sign (i.e., "P" in Table III) and the scaling factor is one, (as shown in the third row of Table III) the bit width of the new sample is 12 bits. The 12 bits include 3 bits for a prefix of "110", 1 bit for the flag of "0", 1 bit for the scaling factor and 7 bits for the flux value.

Where the difference value has a negative sign (i.e., "N" in Table III) and the scaling factor is one, (as shown in the fourth row of Table III) the bit width of the new sample is again 12 bits. This time the 12 bits include 3 bits for a prefix of "110", 1 bit for the flag of "1", 1 bit for the scaling factor and 7 bits for the flux value.

Where the difference value has a positive sign (i.e., "P" in Table III) and the scaling factor is 2–15, (as shown in the fifth row of Table III) the bit width of the new sample is 16 bits. The 16 bits include 4 bits for a prefix of "1110", 1 bit for the flag of "0", 4 bits for the scaling factor and 7 bits for the flux value.

Where the difference value has a negative sign (i.e., "N" in Table III) and the scaling factor is 2–15, (as shown in the sixth row of Table III) the bit width of the new sample is 16 bits. The 16 bits include 4 bits for a prefix of "1110", 1 bit for the flag of "1", 4 bits for the scaling factor and 7 bits for the flux value.

Where the difference value has a positive sign (i.e., P" in Table III) and the scaling factor is 16–127, (as shown in the seventh row of Table III) the bit width of the new sample is 20 bits. The 20 bits include 5 bits for a prefix of "11110", 1 bit for the flag of "0", 7 bits for the scaling factor and 7 bits for the flux value.

Where the difference value has a negative sign (i.e., "N" in Table III) and the scaling factor is 16–127, (as shown in the eighth row of Table III) the bit width of the new sample is again 20 bits. The 20 bits include 5 bits for a prefix of "11110", 1 bit for the flag of "1", 7 bits for the scaling factor and 7 bits for the flux value.

The operation of the circuit of FIG. 5 will be discussed next. As shown, an analog signal is applied to a sample and hold (S/H) module 54. After the signal has been sampled, a S/H controller 60 signals the S/H module 54 to hold a current value of the input signal $S_i$. The current value of the input signal $S_i$ becomes the new sample. The new value is applied to a comparator 56. Within the comparator 56, the new value of the sampled signal is compared with a previous value (provided by a 16 bit digital to analog (D/A) converter 52).

The comparator 56 compares the new sample and old sample and generates a difference signal. The difference signal is applied to a difference controller 58. Within the difference controller 58, a comparison is made with the previous sample to determine a direction of the new sample, which is provided on an up/down (U/D) connection 68. An analog difference output (ADO) is provided on a second output 70 to a 16 bit analog to digital (A/D) converter 62.

Within the A/D converter 62, the analog difference is converted into a 16-bit digital representation of the difference signal. The difference value is transferred to a compression controller 64.

Within the compression controller 64, the difference value is applied as a first input to a 16-bit adder/subtractor 74. A previous (old) sample value in a memory 72 is provided as a second input to the adder/subtractor 74. An input from the U/D connection 68 is provided as a control input to the adder/subtractor 74 to control whether the difference value is added to (or subtracted from) the old sample. Based upon the control from the U/D connection 68, the difference value is added to (or subtracted from) the old sample to produce a new sample. The new sample is stored in a new sample memory 76. The sample stored in the new sample memory 76, in turn, is provided as an input to the DAC 52 for comparison with the next (i.e., the following) sample.

The analog signal on the output (LAV) of the DAC 52 may now equal the saved output (SAV) of the S/H module 54. The difference controller 58 senses the equivalence of the SAV and LAV signals and triggers the S/H controller 60 to sample and hold the new sample.

If a sufficient time period has passed since the last sample was collected, the S/H controller 60 may instruct the S/H module 54 to collect a new sample. The S/H module 54 collects the new sample and the process repeats.

In addition to generating a new sample, the compression controller 64 may also generate a scaling factor. The controller first compares the difference signal from the ADC 62 with a reference value Vrf from a reference source Vrf 80 and if the difference value is greater than the reference value, the controller 64 determines that the scaling factor is greater than zero.

To determine the value of the scaling factor, the controller 64 divides the difference value by Vrf. An integer value of the dividend becomes the scaling factor. The integer value may be multiplied by Vrf and the product subtracted from an absolute value of the difference value. The difference between the product and difference value becomes the flux value.

Figure 6:
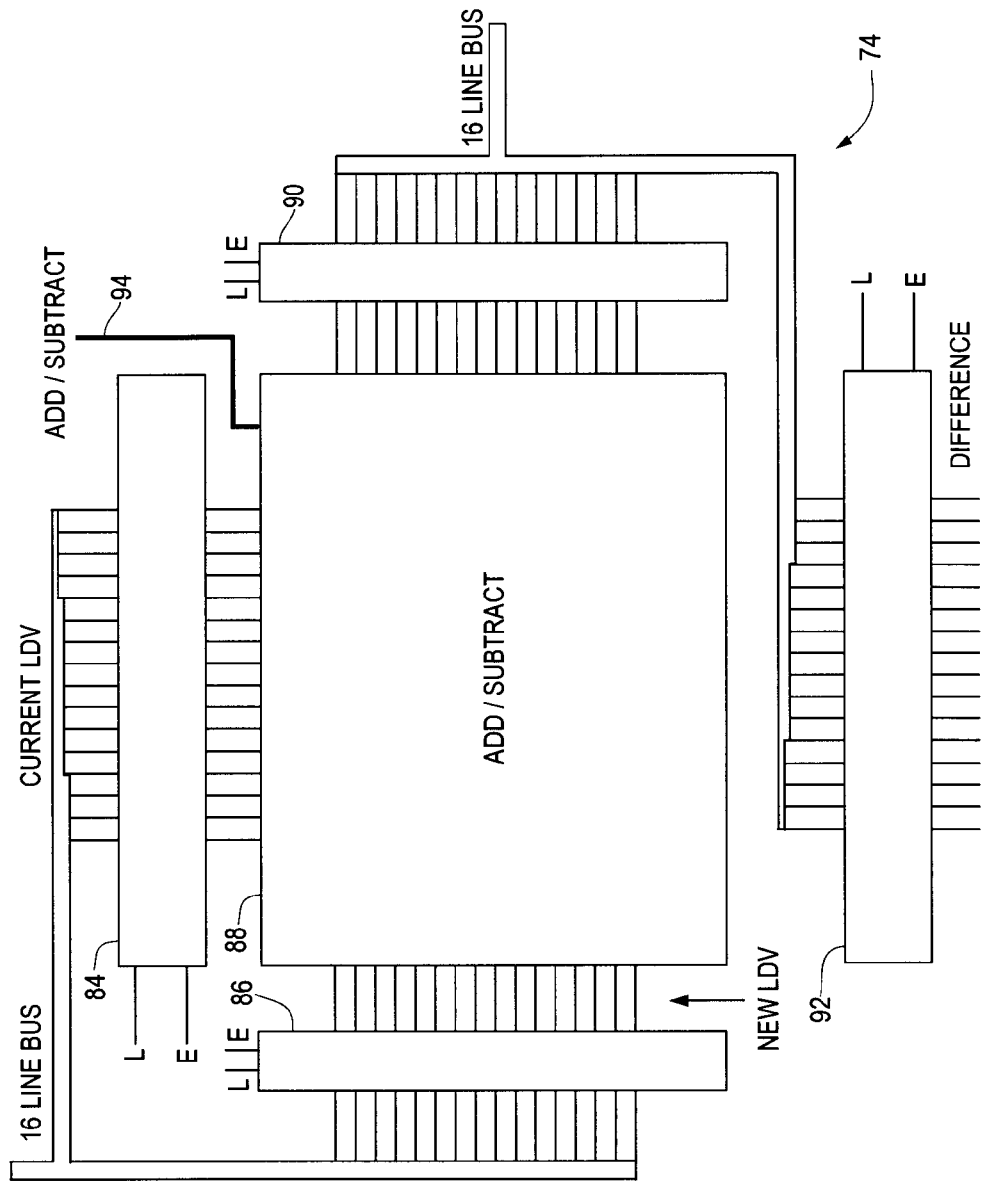
FIG. 6 depicts alternate circuitry of the system of FIG. 5.

FIG. 6 provides a schematic of the add/subtract unit 74 of FIG. 5. As shown, the add/subtract unit 74 may be made up of the add/subtract processing unit 88 and a number of latches 84, 86, 90, 92, each controlled by its own latch input L and enable input E. Also shown is an add/subtract control input 94, which may, in turn, be coupled to the up/down control 68 of the difference controller 58.

Figure 7:
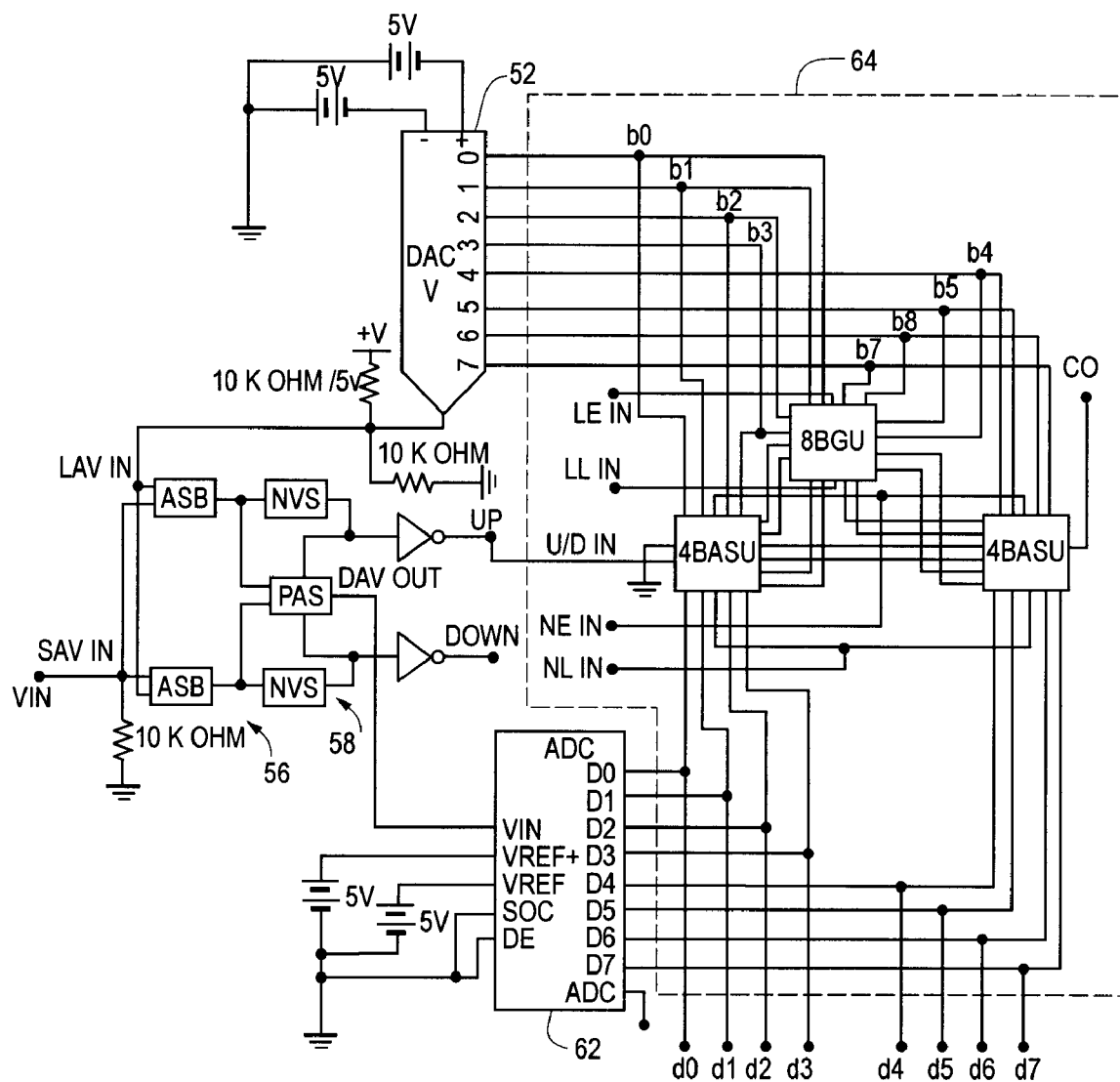
FIG. 7 shows a more detailed example of sampling circuitry that may be used by the system of FIG. 5.

FIG. 7 provides a more detailed example of sampling circuitry of FIG. 5. As shown in FIG. 7, the comparator 56 and difference controller 58 of FIG. 5 may be configured to operate continuously. The ADC 62 may receive a difference analog voltage (DAV) from the difference controller 58. An output of the DAC 62 may be provided to a set of 4-bit add/subtract units (4BASUs). A previous sample may be contained in a add/subtract module used as a memory unit (8BGU). A set of latch inputs, such as a latch enable (LE) and a latch-latch (LL) may be used to control a sample rate. A set of latch inputs for a new sample, such as a new sample enable (NE) and new sample latch (NL) control application of the new sample to the digital processing section.

Figure 8:
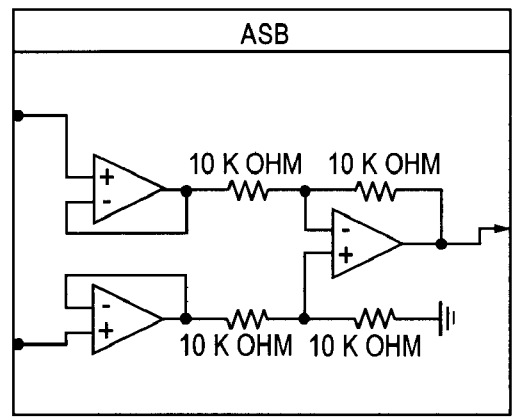
FIG. 8 shows an example of the linear amplifier sample assembly of the comparator of FIG. 7.
Figure 9:
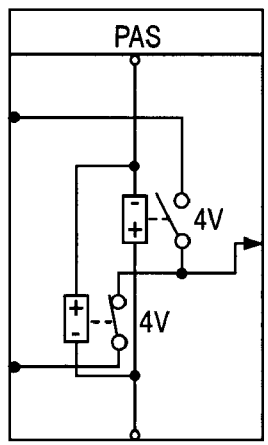
FIGS. 9 and 10 show examples of the driver circuit and linear combiner of FIG. 7.
Figure 10:
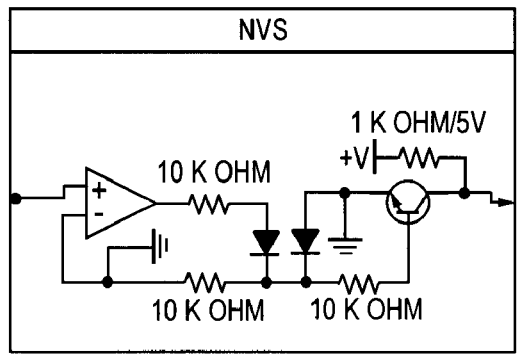

FIG. 8 shows an example of the linear amplifier sample assembly ASB used within the comparator circuit 56 of FIG. 7. FIGS. 9 and 10 show examples of a driver circuit (NVS) and linear combiner (PAS) that may be used to form the difference controller 58.

Figure 11:
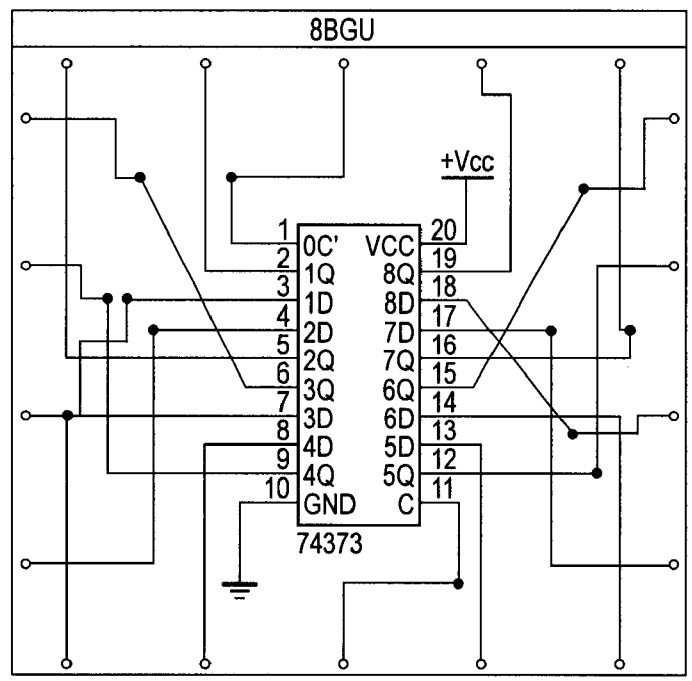
FIG. 11 shows an example of the memory unit of FIG. 7.
Figure 12:
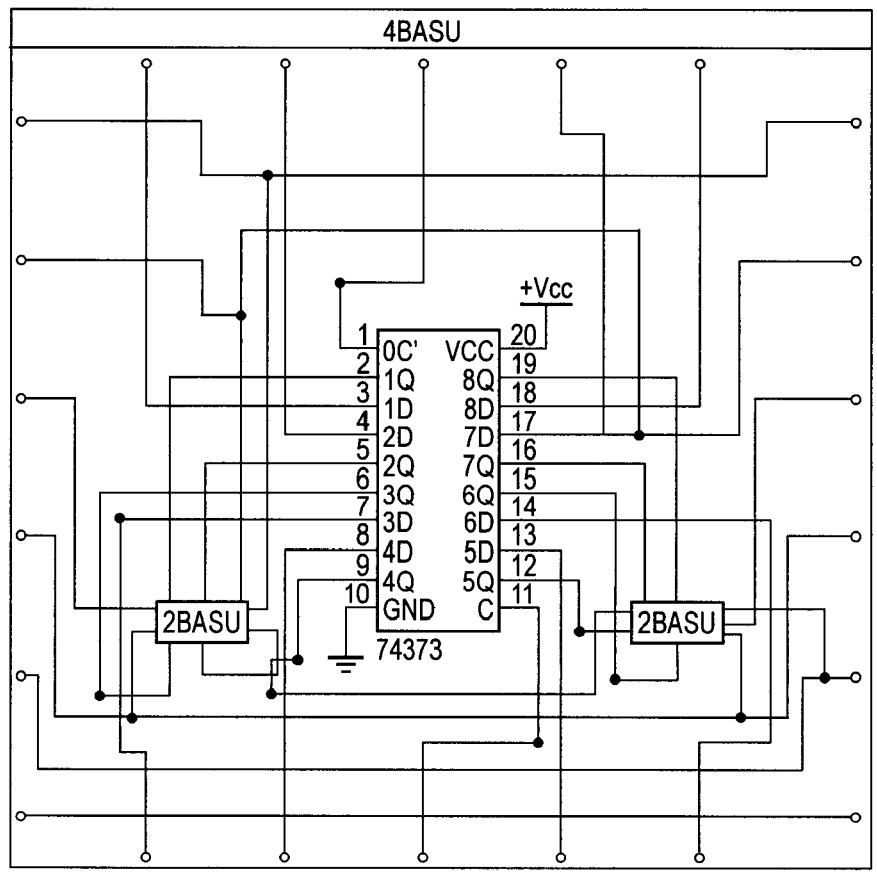
FIG. 12 shows an example of the 4-bit add/subtract unit of FIG. 7.
Figure 13:
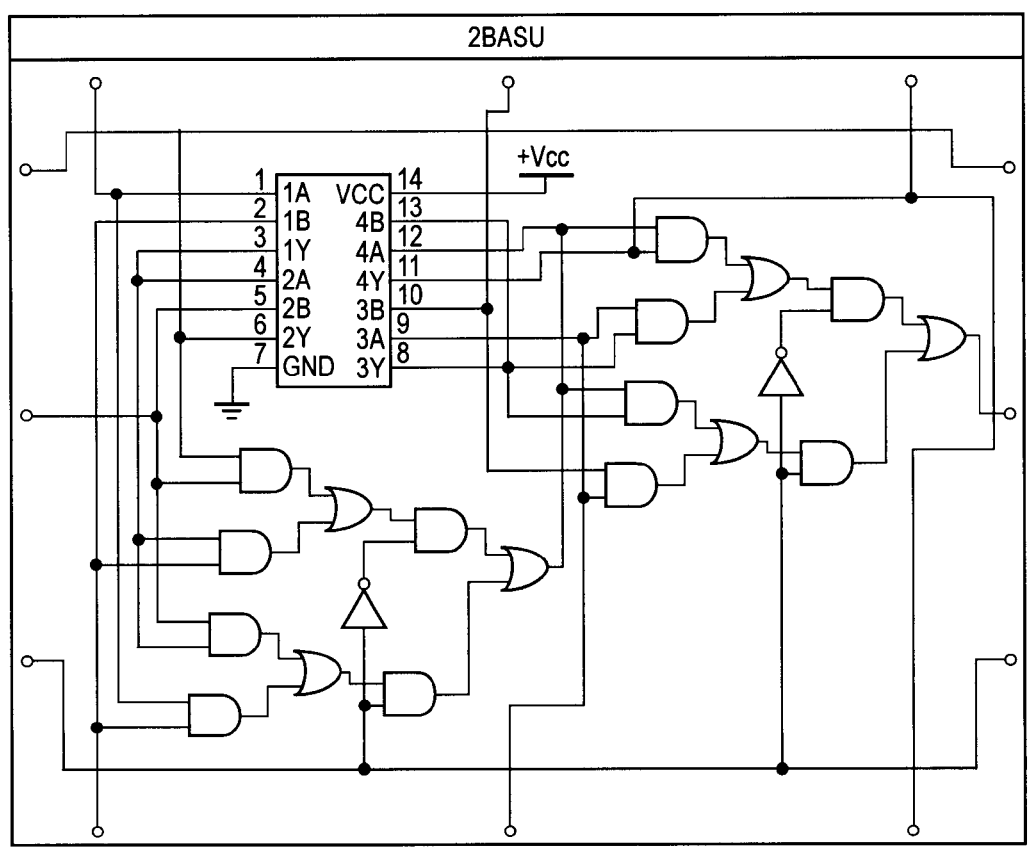
FIG. 13 shows an example of the 2-bit add/subtract unit of FIG. 12.

FIG. 11 shows an example of the memory unit 8BGU that may be used for storing a previous sample in FIG. 7. FIG. 12 shows an example of the four-bit add/subtract unit (4BASU) used in FIG. 7 for adding a difference value to a previous sample value. As shown the 4BASU includes a two-bit add/subtract unit (2BASU) for internal bit processing. FIG. 13 shows an example of the 2BASU of the circuit of FIG. 12.

Figure 14:
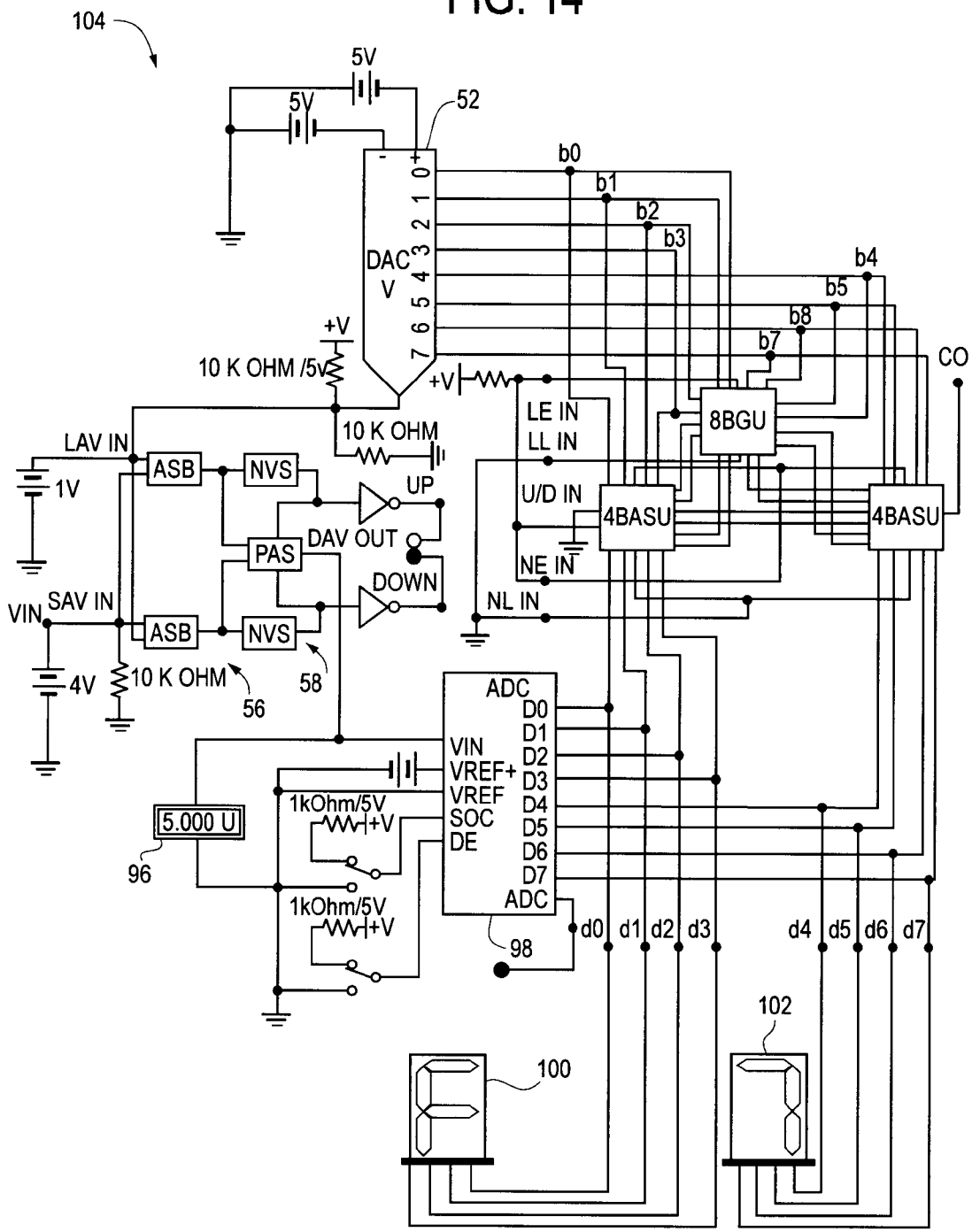
FIG. 14 shows the circuitry of FIG. 7 with exemplary test voltages applied to the circuit.

FIG. 14 shows the circuit of FIG. 7 with exemplary test voltages applied to the circuit. For As shown, the circuit has a last average sample voltage $LAV_{in}$ of 1.0 volt. A new sample voltage $V_{in}=-4.0$ volts is provided. The difference voltage $DAV=V_{in}-LAV_{in}=1.0-(-4.0)=5.0$ volts. The difference voltage DAV of 5.0 volts can be seen reflected in the meter 96 across the ADC 98.

The difference voltage DAV can be seen reflected in the digital readouts 100, 102. In considering the readouts 100, 102, however, the difference voltage DAV must be compared with the reference supply 104. The reference voltage supplied by the reference supply is shown to be 10 volts. Since the difference voltage DAV is 5 volts, the difference voltage DAV is 50% of the full scale value.

The value shown in the digital readouts (with most significant number (MSN) first) is 7F. Since the digital readouts are in hexadecimal, with a maximum value of 256, the value 7F represents a value which is 49.6% of full scale value. The fact that it is not exactly 50% can be attributed to bit error.

Figure 15:
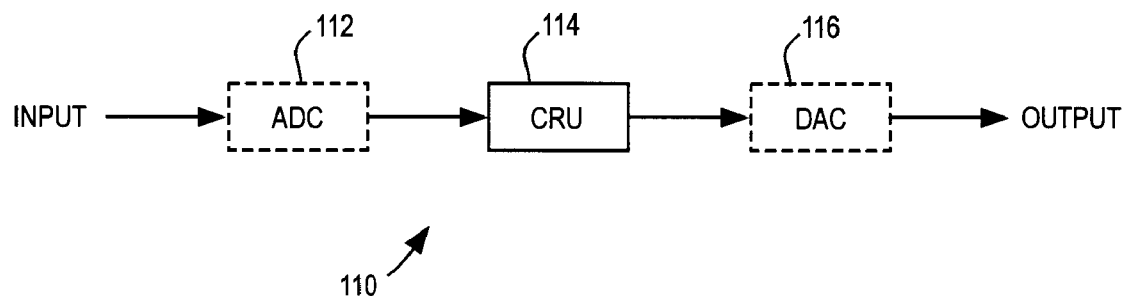
FIG. 15 shows an alternate embodiment of the system of FIG. 1.

Under an alternate illustrated embodiment, the data compression system 10 of FIG. 1 may be implemented using the system 110 of FIG. 15. An optional ADC 112 and DAC 116 are provided for situations where an input and an output are to be provided under an analog format.

Under the illustrated embodiment (FIG. 15), the compression algorithms of Table III are provided by software operating on the CPU 114. Such software may be used to implement a substantially identical functionality to that described above.

Figure 16:
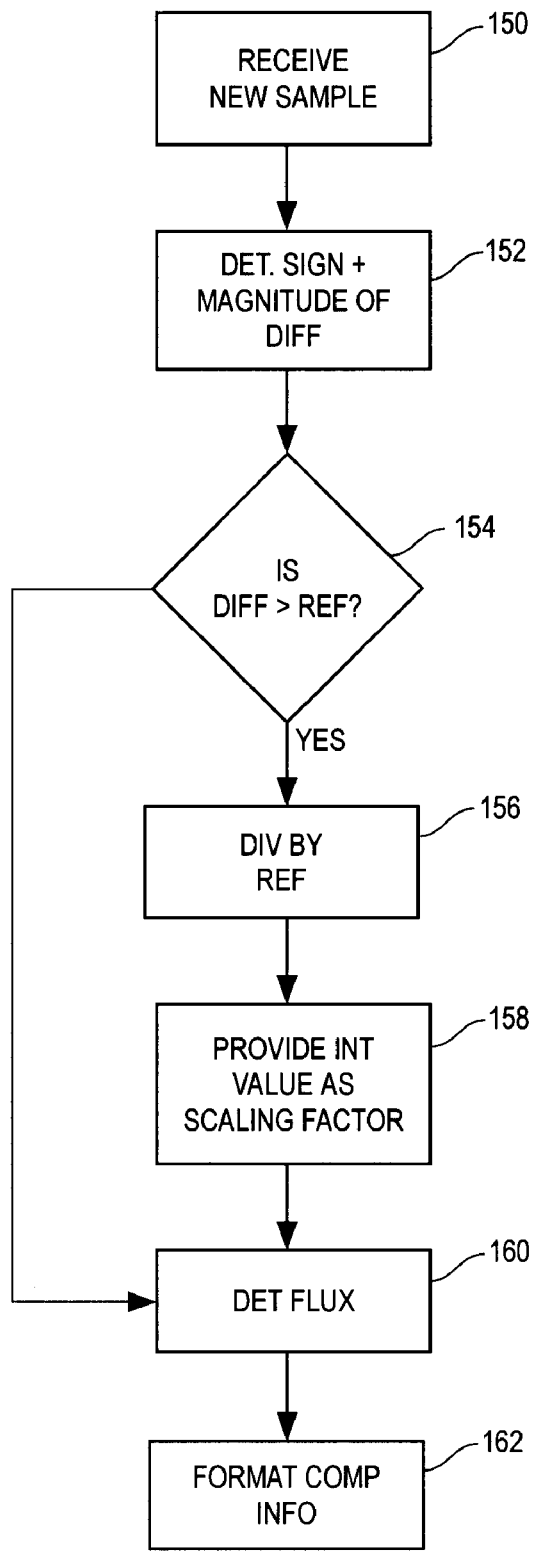
FIG. 16 shows a flow chart of steps that may be used by the system of FIG. 15.

For example, FIG. 16 is a flow chart of method steps that may be performed by the CPU 114 of FIG. 15. As shown, the CPU 114 may receive 150 a sample and compare the new sample with a previous sample. Based upon the comparison, the CPU 114 may determine 152 a magnitude and sign of the difference.

The CPU 114 may compare the difference value with a reference value. If the difference value is less than the reference value, then the CPU 114 may proceed to determine 160 a flux value from the difference.

If the difference is greater than the reference value, then the CPU 114 may divide the difference value by the reference value. Any fractional value of the quotient is removed and the result becomes the scaling factor.

The flux is then determined. The fractional value of the scaling factor division may be used as the flux value. Alternatively if the difference was smaller than the reference value the difference may be divided by the reference value to provide a flux value.

Once the sign, scaling factor and flux value are determined, a variable-length set of compressed samples may be composed as shown in Table III. The variable length samples may be composed of a concatenated prefix, flag and bit codes, as shown by the first three columns of Table III.

Figure 17:
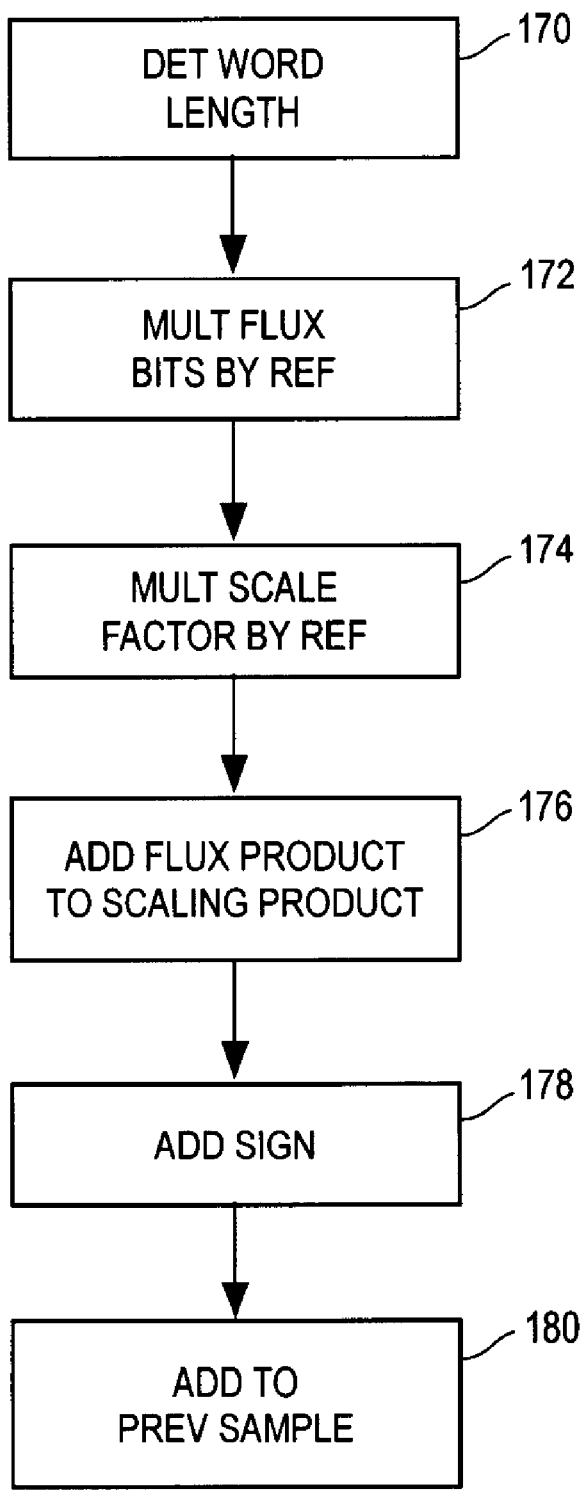
FIG. 17 shows an additional flow chart of steps that may be used by the system of FIG. 15.

Decoding the variable length compressed samples may be accomplished by the CPU 114 as shown in FIG. 17. As shown, a bit length of the compressed sample may first be determined 170. From the bit length, the CPU 114 may be able to determine the location and content of the scaling factor D, as shown in FIG. III. A sign may also be determined from the prefix. A flux value d may also be determined.

Upon determining the scaling factor, the CPU 114 may multiply 172 the scaling factor by the reference value. The CPU 114 may also multiply the flux value by the reference value and add the two products together to obtain a magnitude of the difference value.

Using the difference value and determined sign, the CPU 114 may add or subtract the difference value from a previous sample. If no previous sample value is available, the CPU 114 assumes that the previous sample was zero.

Under an alternative embodiment of the invention, compression may be carried forward on the compressed words under an iterative format. It has been found that carrying compression forward as an iterative process results in additional compression opportunities at various levels of the iterative process.

For example, the following Table IV shows iteration results for the compressed words of Table I. The iteration level is shown along the left margin and the sample number for the first six samples is shown on along the top of the table.

The entries shown in Table IV may be assumed to be made up of two hex values. For purposes of this explanation, the right-most hex value of each entry will be assumed to be represented by a 4-bit value, where the three lower order bits are a flux value and the higher order bit is a sign value.

TABLE IV

|    | #1 | #2 | #3 | #4 | #5 | #6 |
|----|----|----|----|----|----|----|
| #1 | 00 | 01 | 01 | 01 | 01 | 01 |
| #2 | 00 | 02 | 03 | 04 | 05 | 06 |
| #3 | 00 | 02 | 05 | 04 | 06 | 03 |
| #4 | 00 | 02 | 00 | 01 | 06 | 04 |
| #5 | 00 | 02 | 02 | 03 | 00 | 05 |

The first row #1 of compressed words may be created from the sample values shown in Table I. The values of row #1 may now be iteratively compressed to provide the results in row #2. The results in row #2 may then be compressed into the results of row #3, row #3 into row #4 and row #4 into row #5.

The methods of compression used for the iterative process linking rows #1–#5 may differ somewhat from that shown in Table III. However, The iterative process is constant between any particular iterative level (e.g., as depicted by the data of Table IV). As a result, where a particular iterative level (i.e., row of Table IV) provides a compression advantage, that row may be selected as the preferred compressed output. The original data may be recovered exactly, based upon a prior knowledge of the iterative level providing the selected result.

The iterative process may proceed as follows. The first row #1 of Table IV may obtained as described above. Each entry is made up of two hex values. The left hex value represents a scale factor. The right hex value is a sign bit (in the most significant bit position) concatenated to flux values (in the lower bit positions). As a result, the iterative process begins by creating the values of the second row #2.

As above for compression, a first sample of row #2 doesn't have a prior sample value and therefore assumes a value of zero which is added to the value of the corresponding position of the prior iteration (in this case "00"). The result is that the first position of the second row #2 has a value of "00".

The value "00" of the first position of row #2 now becomes the prior value for the second position of row #2. However, when a explicitly provided prior value has a value of "00", the CPU 114 assumes a sign change and adds a value of one to the previous value of zero. The assumed value of "01" is added to the value of the second position of the first row #1 to arrive at the value "02" to be inserted into the second position of the second row #2.

In the third position (i.e., column position #3) of the second row #2, the prior value "02" is added to the value "01" of corresponding column position #3 of row #1. The result is "03". The process continues in column positions #4, 5 and 6 of row #2 resulting in value of "04", "05", and "06".

In the third iterative row the process continues with a few exceptions. In the first column of row #3, the first value remains "00". In the second column, zero value of the first position is no longer assumed to represent a sign change and therefore assumes a value of "00". As a result, the third position of row #3 is obtained by adding "00" to "02" to provide a continuing value of "02" for the third position.

In third position of the third iterative row #3, the prior value of "02" is added to the value "03" of the third position of the second row. The result is "05" which becomes the value stored in the third position of the third row.

In the fourth position of the third iterative row, the prior value of "05" may be added to the new value of "04" of the previous row. However, the highest order bit of "04" has overflowed into the sign position, indicating a sign change. Further, because of the sign change, the CPU 114 adds a value of one to the three lower order bits, resulting in an overall value of "–01", for the fourth entry of the second row. The result of the addition is "04", found in the fourth position of the third row.

In the fifth position of the third iterative row, the value of "04" may now be added to value in the fifth position of the second row. The value "05" in the fifth position of the second row, however, has a one in the sign position, resulting in another sign change. Because of the sign change, the CPU 114 adds a one to the previous value of one of the lower order bits resulting in an overall value of "02", for the fifth position of the second row. When the evaluated value of "02" of the fifth position of the second row is added to the value "04" of the fourth position of the third row the result is "06", shown in the fifth position of the third row.

The process continues for the sixth position. The value of the six position of the second row shows a value of "06", indicating another sign change. The lower order bits have a value of two, to which the CPU 114 adds a value of one, resulting in an evaluated value of "–03", for the six position of the second row. When the evaluated value of "–03" from the six position of the second row is added to the previous value of "06" from the fifth position of the third row, the result is "03", which is shown in the sixth position of the third row. The iterated values of the fourth and fifth rows of Table IV are obtained in a similar manner.

While the simplified example of Table IV does not show an clear reduction in complexity in any of the iterated rows, the same would not be true if the iteration were carried further. Further, once a iteration level has been chosen for coding, the original data may be recovered by reversing the iteration and compression process.

A specific embodiment of a method and apparatus for compression according to the present invention has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention and any and all modifications, variations, or equivalents that fall within the true spirit and scope of the basic underlying principles disclosed and claimed herein.

What is claimed is:

1. A method of compressing data comprising the steps of:
   determining a flux, scaling factor and direction of a difference between a new sample and a previous sample; and
   encoding the difference of the new sample over the previous sample based upon the determined flux, scaling factor and direction of the new sample.

2. The method of compressing data as in claim 1 further comprising determining that the previous sample has a value of zero.

3. The method of compressing data as in claim 1 wherein the step of determining the difference further comprises comparing an estimate of the new sample with the previous sample.

4. The method of compressing data as in claim 3 wherein the step of comparing the new sample with the previous sample further comprises generating a difference signal between the new sample and previous sample.

5. The method of compressing data as in claim 4 wherein the step of generating the difference sample further comprises,adding the generated difference signal to the new sample.

6. The method of compressing data as in claim 1 further comprising defining the determined sign as being positive where the difference is a positive value and negative where the difference is a negative value.

7. The method of compressing data as in claim 1 wherein the step of generating the difference signal further comprises digitizing the difference signal in an analog the digital converter having n bits.

8. The method of compressing data as in claim 7 further comprising defining the determined flux as having a value equal to the n bits of the analog to digital converter.

9. The method of compressing data as in claim 8 further comprising defining the determined scaling factor as an integer multiple of a reference value.

10. The method of compressing data as in claim 9 wherein the step of encoding the difference further comprises appending the determined scaling factor to the n bits of the determined flux.

11. The method of compressing data as in claim 10 wherein the step of appending the determined scaling factor further comprises appending a prefix equal to the scaling factor.

12. The method of compressing data as in claim 11 wherein the step of appending the prefix further comprises appending an additional bit value of 1 to the prefix for a negative sign value.

13. The method of compressing data as in claim 1 further comprising iteratively compressing the compressed data.

14. Apparatus for compressing data comprising:
    means for determining a flux, scaling factor and direction of a difference between a new sample and a previous sample; and
    means for encoding the difference of the new sample over the previous sample based upon the determined flux, scaling factor and direction of the new sample.

15. The apparatus for compressing data as in claim 14 further comprising means for determining that the previous sample has a value of zero.

16. The apparatus for compressing data as in claim 14 wherein the means for determining the difference further comprises means for comparing an estimate of the new sample with the previous sample.

17. The apparatus for compressing data as in claim 16, wherein the means for comparing the new sample with the previous sample further comprises means for generating a difference signal between the new sample and previous sample.

18. The apparatus for compressing data as in claim 17 wherein the means for generating the difference sample further comprises means for adding the generated difference signal to the new sample.

19. The apparatus for compressing data as in claim 14 further comprising means for defining the determined sign as being positive where the difference is a positive value and negative where the difference is a negative value.

20. The apparatus for compressing data as in claim 14 wherein the means for generating the difference signal further comprises means for digitizing the difference signal in an analog to digital converter having n bits.

21. The apparatus for compressing data as in claim 20 further comprising means for defining the determined flux as having a value equal to the n bits of the analog to digital converter.

22. The apparatus for compressing data as in claim 21 further comprising means for defining the determined scaling factor as an integer multiple of a reference value.

23. The apparatus for compressing data as in claim 22 wherein the means for encoding the difference further comprises means for appending the determined scaling factor to the n bits of the determined flux.

24. The apparatus for compressing data as in claim 23 wherein the means for appending the determined scaling factor further comprises means for appending a prefix equal to the scaling factor.

25. The apparatus for compressing data as in claim 24 wherein the means for appending the prefix further comprises means for appending an additional bit value of 1 to the prefix for a negative sign value.

26. The apparatus for compressing data as in claim 14 further comprising means for iteratively compressing the compressed data.

27. Apparatus for compressing data comprising:
    a compression processor adapted to determine a flux, scaling factor and direction of a difference between a new sample and a previous sample; and
    a formatter adapted to encode the difference of the new sample over the previous sample based upon the determined flux, scaling factor and direction of the new sample.

28. The apparatus for compressing data as in claim 27 further comprising a memory adapted to store the previous sample.

29. The apparatus for compressing data as in claim 28 wherein the compression processor further comprises a comparator adapted to compare an estimate of the new sample with the previous sample.

30. The apparatus for compressing data as in claim 29 wherein the comparator further comprises a subtractor adapted to generate a difference signal between the new sample and previous sample.

31. The apparatus for compressing data as in claim 30 wherein the subtractor further comprises an adder adapted to add the generated difference sample to the estimate of the new sample.

* * * * *